United States Patent
Liu et al.

(10) Patent No.: US 9,842,988 B2
(45) Date of Patent: Dec. 12, 2017

(54) MAGNETIC TUNNEL JUNCTION WITH LOW DEFECT RATE AFTER HIGH TEMPERATURE ANNEAL FOR MAGNETIC DEVICE APPLICATIONS

(71) Applicant: Headway Technologies, Inc., Milpitas, CA (US)

(72) Inventors: Huanlong Liu, San Jose, CA (US); Yuan-Jen Lee, Fremont, CA (US); Jian Zhu, San Jose, CA (US); Guenole Jan, San Jose, CA (US); Po-Kang Wang, Los Altos, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 14/803,111

(22) Filed: Jul. 20, 2015

(65) Prior Publication Data
US 2017/0025602 A1   Jan. 26, 2017

(51) Int. Cl.
*H01L 29/82*   (2006.01)
*H01L 43/10*   (2006.01)
(Continued)

(52) U.S. Cl.
CPC .......... *H01L 43/10* (2013.01); *G11C 11/161* (2013.01); *H01F 10/3286* (2013.01);
(Continued)

(58) Field of Classification Search
CPC ......... B82Y 10/00; B82Y 25/00; B82Y 40/00; G11B 5/3906; G11B 5/3909; G11C 11/15;
(Continued)

(56) References Cited

U.S. PATENT DOCUMENTS

| 8,059,374 B2 | 11/2011 | Zhao et al. |
| 8,686,484 B2 | 4/2014 | Whig et al. |

(Continued)

FOREIGN PATENT DOCUMENTS

| EP | 1 903 623 | 3/2008 |
| WO | WO2010026703 | 3/2010 |
| WO | WO2015040926 | 3/2015 |

OTHER PUBLICATIONS

PCT Search Report, Application No. PCT/US2016/042985, Applicant: Headway Technologies, Inc., dated Oct. 24, 2016, 13 pgs.

*Primary Examiner* — Mohammed Shamsuzzaman
(74) *Attorney, Agent, or Firm* — Saile Ackerman LLC; Stephen B. Ackerman

(57) ABSTRACT

A magnetic tunnel junction is disclosed wherein the reference layer and free layer each comprise one layer having a boron content from 25 to 50 atomic %, and an adjoining second layer with a boron content from 1 to 20 atomic %. One of the first and second layers in each of the free layer and reference layer contacts the tunnel barrier. Each boron containing layer has a thickness of 1 to 10 Angstroms and may include one or more B layers and one or more Co, Fe, CoFe, or CoFeB layers. As a result, migration of non-magnetic metals along crystalline boundaries to the tunnel barrier is prevented, and the MTJ has a low defect count of around 10 ppm while maintaining an acceptable TMR ratio following annealing to temperatures of about 400° C. The boron containing layers are selected from CoB, FeB, CoFeB and alloys thereof including CoFeNiB.

11 Claims, 4 Drawing Sheets

(51) Int. Cl.
*G11C 11/16* (2006.01)
*H01L 43/02* (2006.01)
*H01L 43/08* (2006.01)
*H01L 43/12* (2006.01)
*H01F 41/30* (2006.01)
*H01F 10/32* (2006.01)

(52) U.S. Cl.
CPC ....... *H01F 10/3295* (2013.01); *H01F 41/307* (2013.01); *H01L 43/02* (2013.01); *H01L 43/08* (2013.01); *H01L 43/12* (2013.01); *H01F 10/329* (2013.01); *H01F 10/3272* (2013.01)

(58) Field of Classification Search
CPC ............... G11C 11/161; H01F 10/3254; H01F 10/3272; H01F 41/302; H01L 27/228; H01L 43/08; H01L 43/12; H01L 43/02; H01L 43/10
USPC ................. 257/421, 295; 360/324.12, 324.2; 331/94.1
See application file for complete search history.

(56) References Cited

U.S. PATENT DOCUMENTS

| 8,852,762 | B2 | 10/2014 | Abraham et al. | |
| 8,946,834 | B2* | 2/2015 | Wang | G11B 5/82 257/421 |
| 9,177,575 | B1* | 11/2015 | Gao | G11B 5/3909 |
| 2009/0091864 | A1* | 4/2009 | Carey | B82Y 25/00 360/324.11 |
| 2010/0033878 | A1* | 2/2010 | Tsunekawa | B82Y 10/00 360/313 |
| 2010/0072524 | A1* | 3/2010 | Huai | B82Y 10/00 257/295 |
| 2010/0073827 | A1* | 3/2010 | Zhao | B82Y 10/00 360/324.2 |
| 2010/0177449 | A1* | 7/2010 | Zhao | B82Y 10/00 360/324.12 |
| 2012/0280336 | A1* | 11/2012 | Jan | H01L 43/08 257/421 |
| 2013/0240963 | A1* | 9/2013 | Beach | H01L 43/08 257/295 |
| 2014/0145792 | A1* | 5/2014 | Wang | H01F 10/3272 331/94.1 |
| 2015/0069553 | A1 | 3/2015 | Nagase et al. | |
| 2016/0079520 | A1* | 3/2016 | Park | H01L 29/82 257/421 |
| 2016/0197266 | A1* | 7/2016 | Kitagawa | H01L 43/08 257/421 |

* cited by examiner

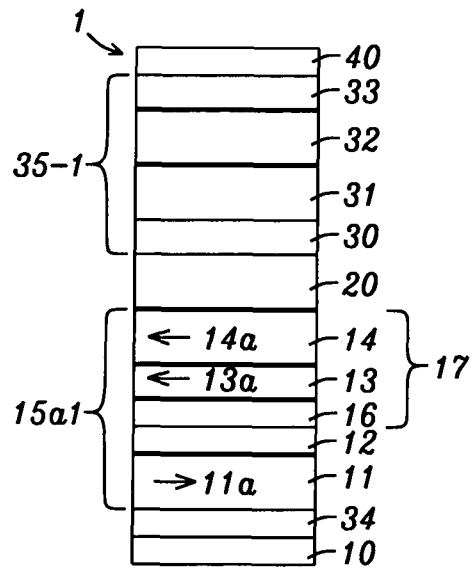
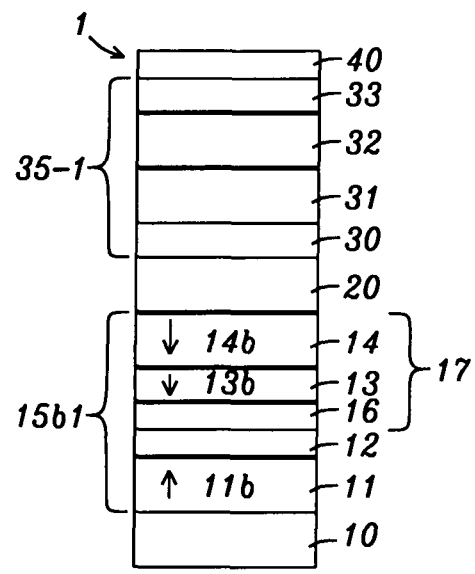
FIG. 1a          FIG. 1b
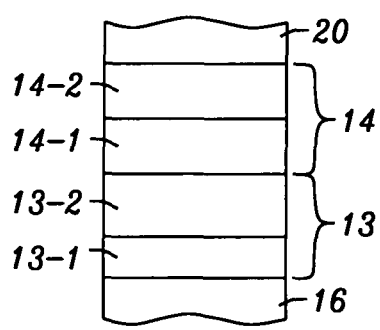
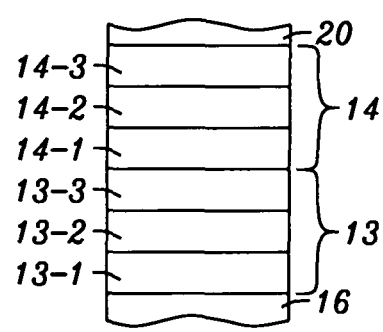
FIG. 1c          FIG. 1d

MAGNETIC TUNNEL JUNCTION WITH LOW DEFECT RATE AFTER HIGH TEMPERATURE ANNEAL FOR MAGNETIC DEVICE APPLICATIONS

RELATED PATENT APPLICATIONS

This application is related to the following: U.S. Pat. No. 8,059,374; and U.S. Pat. No. 8,946,834; both assigned to a common assignee, and which are herein incorporated by reference in their entirety.

TECHNICAL FIELD

The present disclosure relates to magnetic random access memory (MRAM), spin-torque MRAM, and other spintronic devices having a magnetic tunnel junction (MTJ) wherein magnetic layers are designed to prevent diffusion of non-magnetic elements into a tunnel barrier layer between two magnetic layers thereby providing a low defect rate after high temperature annealing around 400° C.

BACKGROUND

A MTJ is a key component in MRAM, spin-torque MRAM, and other spintronic devices and comprises a tunnel barrier layer such as a metal oxide formed between two magnetic layers that together generate a tunneling magnetoresistance (TMR) effect. One of the magnetic layers is a free layer and serves as a sensing layer by switching the direction of its magnetic moment in response to external fields (media field) while the second magnetic layer has a magnetic moment that is fixed and functions as a reference layer. The electrical resistance through the tunnel barrier layer (insulator layer) varies with the relative orientation of the free layer moment compared with the reference layer moment and thereby provides an electrical signal that is representative of a magnetic state in the free layer. In a MRAM, the MTJ is formed between a top conductor and bottom conductor. When a current is passed through the MTJ, a lower resistance is detected when the magnetization directions of the free and reference layers are in a parallel state ("0" memory state) and a higher resistance is noted when they are in an anti-parallel state or "1" memory state. The tunnel barrier is typically about 10 Angstroms thick so that a current through the tunnel barrier can be established by a quantum mechanical tunneling of conduction electrons.

Both of the reference layer and free layer may have a synthetic anti-ferromagnetic (SyAF) configuration in which an outer layer is anti-ferromagnetically coupled through a non-magnetic coupling layer to an inner layer that contacts the tunnel barrier. MgO is often preferred as the tunnel barrier and provides a high TMR ratio when adjoining a CoFe or Fe inner magnetic layer. The TMR ratio is known as dR/R where R is the minimum resistance of the MTJ, and dR is the change in resistance observed by changing the magnetic state of the free layer. A higher TMR ratio improves the readout speed. Moreover, a high performance MTJ requires a low areal resistance RA (area×resistance) value of about 1 ohm-um$^2$, a free layer with low magnetostriction ($\lambda$) between $-5\times10^{-6}$ and $5\times10^{-6}$, low coercivity (Hc), and low interlayer coupling (Hin) between the free layer and reference layer through the tunnel barrier layer.

A high TMR ratio is obtained when the MTJ stack forms a face centered cubic (fcc) crystal structure. However, a naturally deposited CoFe or Fe tends to form a body centered cubic (bcc) crystal orientation that prevents formation of the fcc structure for a CoFe/MgO/CoFe stack. A popular solution to this problem is to deposit amorphous CoFeB or FeB rather than CoFe or Fe. As a result, there is no template for crystal structure growth until annealing when B tends to diffuse away from the tunnel barrier to leave a CoFe or Fe interface with the metal oxide tunnel barrier. Meanwhile, MgO forms a fcc structure that induces fcc crystal growth in the adjoining magnetic layers. The boron content in the CoFeB and FeB layers is about 20% or less since B needs to diffuse away from the interfaces with the tunnel barrier layer to achieve high TMR ratio.

In order to realize a smaller Hc but still maintain a high TMR ratio, the industry tends to use CoFeB as the free layer in a TMR sensor. Unfortunately, the magnetostriction ($\lambda$) of a CoFeB free layer is considerably greater than the maximum acceptable value of about $5\times10^{-6}$ for high density memory applications. Furthermore, a free layer may include a non-magnetic insertion layer (INS) in a FL1/INS/FL2 stack, for example, where the insertion layer is sandwiched between two ferromagnetic layers (FL1, FL2) to provide anti-ferromagnetic coupling or a moment diluting effect. However, the non-magnetic materials do not bind well with CoFeB and tend to diffuse at elevated temperatures along grain boundaries in crystalline magnetic layers. As a result, non-magnetic metals may diffuse through a free layer or reference layer into the tunnel barrier during or after annealing, and disrupt the insulation property of the barrier thereby causing a device defect. This type of diffusion is even more pronounced in semiconductor devices wherein MRAM devices are integrated (embedded) with complementary metal-oxide-semiconductor (CMOS) units that are processed at temperatures as high as 400° C. Thus, an improved free layer (or reference layer) design is needed to reduce non-magnetic metal diffusion into a tunnel barrier layer while maintaining other MTJ properties such as low Hc, and Hin, and high TMR ratio following process temperatures as high as 400° C.

SUMMARY

One objective of the present disclosure is to provide a magnetic layer structure that can serve as one or both of a free layer or reference layer in a MTJ, and maintain a defect level of <50 ppm therein after high temperature annealing by inhibiting the migration of non-magnetic metals toward an interface with an adjoining tunnel barrier.

A second objective of the present disclosure is to provide a MTJ with a magnetic layer structure according to the first objective that also has acceptable $\lambda$, Hc, Hin, and TMR ratio values.

A further objective is to provide a method of forming a MTJ with a magnetic layer structure according to the first and second objectives that can be readily implemented in a manufacturing process and is cost effective.

According to one embodiment of the present disclosure, these objectives are achieved with a bottom spin valve configuration when forming a MTJ on a suitable substrate such as a bottom conductor in a MRAM device. A seed layer and an optional antiferromagnetic (AFM) pinning layer may be sequentially formed on the bottom conductor. In a preferred embodiment, a reference layer/tunnel barrier/free layer stack of layers is formed on the seed layer or AFM layer. The reference layer may have an AP2/NM1/AP1 configuration wherein an "outer" AP2 ferromagnetic layer contacts the seed layer or AFM layer, NM1 is a first non-magnetic metal or alloy layer used for an antiferromagnetic coupling or moment diluting effect, and AP1 is an inner ferromagnetic layer that contacts the tunnel barrier at a first surface. AP1 comprises a first layer with a B content of 25-50 atomic %, and a second layer having a B content from about 1-20 atomic %. The first and second AP1 layers form an interface with each other, and one of the two AP1 layers contacts the tunnel barrier. There may be a third AP1 layer that is formed a greater distance from the tunnel barrier than the first and second layers such that the third AP1 layer adjoins the NM1 layer. The tunnel barrier is preferably MgO although other metal oxides, metal nitrides, or metal oxynitrides may be used. The free layer stack has first magnetic layer with a high B content of 25-50 atomic %, and a second magnetic layer with a B content from 1-20 atomic %. The first and second magnetic layers form an interface with each other and one of the two magnetic layers contacts the tunnel barrier on a surface that is opposite the first surface.

In some embodiments, the free layer stack has a FL1/FL2/NM2/FL3 where FL1 and FL2 are the first and second magnetic layers, NM2 is a second non-magnetic metal or alloy, and FL3 is a third magnetic layer. The B containing layers with elevated B content in the AP1 reference layer and free layer stack are advantageously employed to substantially reduce the migration of non-magnetic metals in NM1 and NM2, respectively, to the tunnel barrier.

The FL1, FL2, and first and second AP1 layers have a composition that is selected from CoB, FeB, CoFeB, CoFeNiB, or CoFeBQ where Q is one of Zr, Hf, Nb, Mo, Ta, and W. In some embodiments, one or more of FL2 and the AP1 layers may be made of a different alloy than the FL1 alloy. For example, FL1 may be CoB while one or more of FL2 and the AP1 layers are one of FeB, CoFeB, CoFeNiB, or CoFeBQ. Each of the B containing layers has a thickness of 1 to 10 Angstroms. In some embodiments, a boron containing layer such as CoFeB may comprise a bilayer that is CoFe/B or B/CoFe. In other embodiments, the boron containing layer may be a multilayer structure with one or more B layers and one or more layers of Co, Fe, CoFe, CoFeB, CoFeNi, or CoFeQ. NM1 and NM2 are selected from a metal M that is Ru, Rh, Ir, Ta, W, Mo, Cr, and Mg, or may be an alloy including one of the M metals and one of Ni, Fe, or Co. Preferably, the FL1/FL2 stack and the AP1 layer each have a total thickness less than about 20 Angstroms to promote perpendicular magnetic anisotropy in the free layer and reference layer, respectively.

In an alternative embodiment, the MTJ may have a top spin valve structure where the free layer, tunnel barrier, and reference layer are sequentially formed on the seed layer or AFM layer. In this case, the free layer has a FL3/NM2/FL2/FL1 stack where FL3 contacts the seed layer or AFM layer, and FL1 contacts a bottom surface of the tunnel barrier. The reference layer may have an AP1/NM1/AP2 configuration wherein the AP1 layer contacts a top surface of the tunnel barrier.

All of the MTJ layers may be deposited in the same sputter chamber. Magnetic layers may be deposited at room temperature or up to 400° C. The tunnel barrier is typically formed by first depositing a metal layer such as Mg on the AP1 reference layer, performing a natural oxidation or radical oxidation step, and then depositing a second metal layer on the oxidized first metal layer. The metal deposition and oxidation sequence may be repeated before an upper metal layer is deposited on the tunnel barrier stack. After all layers in the MTJ are laid down, a high temperature anneal up to 400° C. is performed to transform the tunnel barrier stack into a substantially uniform metal oxide layer wherein the upper metal layer becomes oxidized. Thereafter, the MTJ stack is patterned to form a plurality of MTJ elements. A dielectric layer is deposited to fill the gaps between adjacent MTJ elements prior to forming a top electrode thereon.

BRIEF DESCRIPTION OF THE DRAWINGS

FIGS. 7-9 depict cross-sectional views and show a sequence of steps for forming a MRAM device that comprises a MTJ element according to an embodiment of the present disclosure.

DETAILED DESCRIPTION

Figure 1E:
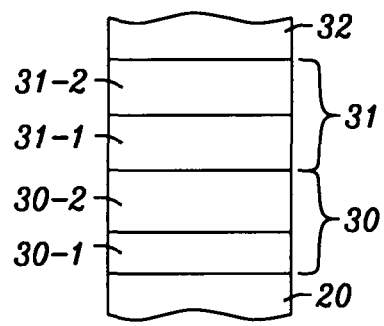
FIGS. 1a-1b are cross-sectional views showing a MTJ stack of layers in a bottom spin valve configuration according to an embodiment of the present disclosure.

The present disclosure relates to a MTJ element wherein each of a reference layer and free layer are multilayer structures including a first layer with high B content of 25-50 atomic %, and a second layer with a low boron content from 1-20 atomic %. The high B content layers prevent non-magnetic metals in other portions of the MTJ from migrating into the tunnel barrier during annealing and other processes with temperatures proximate to 400° C. thereby enabling devices with low defect counts around 10 ppm. The MTJ may have a bottom spin valve, top spin valve, or dual spin value configuration as appreciated by those skilled in the art. The MTJ element may be implemented in a variety of memory devices including but not limited to MRAM, embedded MRAM, spin-torque MRAM, and other spintronic devices such as a spin torque oscillator (STO).

As mentioned previously, many memory devices including embedded MRAM are now incorporated into CMOS platforms to provide higher performance. However, we have observed a substantially higher defect rate when conventional MTJ elements annealed in the range of 300-330° C. are subsequently exposed to temperatures around 400° C. that are required in CMOS processing. Thus, we were motivated to redesign the typical reference layer/tunnel barrier/free layer stack in a MTJ to be compatible with CMOS fabrication by modifying each of the free layer and reference layer to enable a low defect rate of <50 ppm (defects per million parts), and preferably about 10 ppm, after 400° C. annealing.

Although not bound by theory, it is our belief that a means of preventing non-metal migration into a tunnel barrier layer is to disrupt crystal formation in at least a portion of the free layer and/or reference layer that is proximate to the tunnel barrier. Non-magnetic metals such as Ru, Rh, or Ir that are employed as antiferromagnetic coupling agents in a reference layer, or Ta, Mo, W, Mg, Cr, and the like that are used for a moment diluting effect in a free layer do not bind well with magnetic layers including CoFeB or the like. Thus, when CoFeB with low B content below 20 atomic % begins to crystallize at annealing temperatures between 300° C. and 400° C., pathways are created at grain boundaries and become channels for non-magnetic metal migration from within the free layer or reference layer to the tunnel barrier. We have discovered that by increasing the amorphous character of a reference layer and free layer in a portion thereof proximate to the tunnel barrier, crystal formation in said region is disrupted or delayed to an extent that considerably slows movement of non-magnetic metals to the tunnel barrier. As a result, low defect levels that are 10 ppm, for example, after conventional annealing at 330° C. may also be achieved after elevated annealing temperatures of about 400° C. Here, the term "about 400° C." is defined to mean temperatures that may in some embodiments reach 410-420° C. for 30 minutes or less.

Referring to FIGS. 1a-1b, a first embodiment of the present disclosure is shown wherein a MTJ stack 1 is depicted from a cross-sectional view. The MTJ stack of layers in a bottom spin valve configuration may be formed on a bottom conductor (not shown) in a MRAM device, for example. The bottom layer 10 in the MTJ stack may be a seed layer such as NiCr, NiFeCr, or other materials used in the art to promote the desired crystal structure in overlying layers. In other embodiments, the bottom layer may be a stack including a plurality of seed layers selected from Ta, Ru, NiCr, Cr, NiFeCr, Zr, Hf, Nb, Mg, Ti, and the like. An optional antiferromagnetic (AFM) pinning layer 34 that is one of IrMn, PtMn, NiMn, OsMn, RuMn, RhMn, PdMn, RuRhMn, or MnPtPd may be employed between the bottom layer and the AP2 magnetic layer 11 in order to pin the magnetic moment in the overlying AP2 magnetic layer. The AP2 magnetic layer is part of a reference layer 15a1 (FIG. 1a) or 15b1 (FIG. 1b) having an AP2/NM1/AP1 configuration where NM1 is a first non-magnetic layer.

When the optional AFM layer is inserted between the bottom layer 10 and the AP2 layer 11, the AP2 layer may also be referred to as a pinned layer having a magnetic moment 11a that is fixed an in-plane direction (FIG. 1a). In an alternative embodiment where the magnetic moment 11b is fixed in a perpendicular-to-plane direction (FIG. 1b), an AFM layer is not required. In FIG. 1b, the AP2 layer is said to have perpendicular magnetic anisotropy (PMA) where the shape anisotropy that promotes magnetization in an in-plane direction is less than the magnitude of the PMA component. Preferably, when the AP2 layer has PMA, the AP1 layer 17 that is comprised of lower magnetic layer 13 and upper magnetic layer 14 also has PMA. The AP1 layer may further comprise an optional magnetic layer 16 made of Co, Fe, CoFe, or alloys thereof with Ni, B, or other metals that is understood to have a magnetic moment in the same direction as layers 13, 14.

In FIG. 1a where the NM1 layer 12 is an antiferromagnetic coupling layer such as Ru, Rh, or Ir, AP1 layers 13, 14 have a magnetic moment 13a, 14a, respectively, in a direction opposite to that of magnetic moment 11a in the AP2 layer. Thus, the reference layer is said to have a synthetic anti-parallel (SyAP) configuration that is beneficial in balancing the bipolar field and writing symmetry. In one aspect, at least the upper AP1 layer 14 is amorphous when deposited in order to provide a more uniform surface on which to form the tunnel barrier 20.

In a preferred embodiment shown in FIG. 1b, AP1 layers 13, 14 have a magnetic moment 13b, 14b, respectively, opposite to the magnetic moment 11b for the AP2 layer, and all AP1, AP2 layers have PMA. The PMA configuration in FIG. 1b is typically favored over the in-plane embodiment since PMA provides higher thermal stability for reference layer 15b1 (and free layer 35-1) as the MTJ in-plane dimensions are scaled down to provide higher density memory devices.

In alternative embodiments (not shown) where the NM1 layer 12 is a moment diluting layer that is a made of an element M selected from Ru, Ta, Ti, W, Zr, Hf, Nb, Mo, V, Mg, and Cr, or is an alloy which includes a magnetic element (Fe, Co, or Ni) and a non-magnetic element M, the magnetic moments of all three layers 11, 13, 14 are aligned in the same direction. The NM1 layer is preferably amorphous to block the growth of a crystalline AP1 layer until a subsequent anneal step. In some embodiments, all magnetic moments are in-plane while in other embodiments where all AP1 and AP2 layers have PMA, all magnetic moments in the reference layer 15b1 are in a perpendicular-to-plane direction when NM1 is a moment diluting layer. A moment diluting material in this context is defined as a non-magnetic metal or alloy that is employed to replace a portion of the magnetic material in a reference (or free) layer thereby decreasing the overall magnetic moment for the reference layer or free layer while maintaining essentially a constant reference layer or free layer thickness. It should be understood that when NM1 is an alloy, increasing the content of the magnetic element in the alloy will increase the coupling strength between the AP1 and AP2 layers but may lower the TMR ratio. Furthermore, the thickness of the NM1 layer may vary from about 1 to 10 Angstroms in order to adjust the TMR ratio, magnetostriction ($\lambda$), and coupling strength (Hin) between the AP1 and AP2 layers.

Returning to FIG. 1a or FIG. 1b, the lower AP1 layer 13 is a first boron containing alloy wherein the B content is from 25-50 atomic %, and the upper AP1 layer 14 is a second boron containing alloy wherein the B content is from 1 to 20 atomic %. In related U.S. Pat. No. 8,059,374 and U.S. Pat. No. 8,946,834, we disclosed an upper limit to B content of 40 atomic % in a magnetic alloy in a magnetic layer. However, we have surprisingly discovered that the B content may be raised to 50 atomic % in the first boron containing alloy in AP1 layer 13 and in the subsequently deposited FL1 layer 30 without substantially affecting MTJ performance including TMR ratio. As mentioned earlier, boron tends to migrate away from the tunnel barrier during annealing to leave a region of free layer (and reference layer) adjacent to the tunnel barrier that is substantially free of boron. A high TMR ratio is thereby achieved with the resulting reference layer/tunnel barrier/free layer stack.

The first and second boron containing layers are not necessarily formed from the same elements. Each of the AP1 layers 13, 14 has a composition that is selected from one of CoB, FeB, CoFeB, CoFeNiB, or CoFeBQ where Q is one of Zr, Hf, Nb, Ta, Mo, or W. Preferably, each of AP1 layer 13 and AP1 layer 14 has a thickness from 1 to 10 Angstroms. Furthermore, one or both of the AP1 layers may be comprised of a bilayer configuration such as 13-1/13-2 (and 14-1/14-2) as depicted in FIG. 1c wherein a first layer is Co, Fe, CoFe, CoFeNi, CoFeQ, or CoFeB, and the second layer is B. For example, instead of a CoFeB alloy, one or both of the AP1 layers 13, 14 may be represented by a CoFe/B or B/CoFe configuration. In yet another embodiment shown in FIG. 1d, one or both of the AP1 layers may have a multilayer configuration such as 13-1/13-2/13-3 (and 14-1/14-2/14-3) including one or more boron layers, and one or more layers selected from Co, Fe, CoFe, CoFeB, CoFeNi, and CoFeQ in order to adjust the boron content in an AP1 layer.

Tunnel barrier 20 contacts a top surface of AP1 layer 14. The tunnel barrier may be an oxide, oxynitride, or nitride of Mg, Ti, AlTi, MgZn, Al, Zn, Zr, Ta, or Hf, or a native CoFeB, CoB, or FeB oxide. In other embodiments, the tunnel barrier may be a laminated stack of one or more of the aforementioned materials. The tunnel barrier is typically around 10 Angstroms thick but the thickness may be adjusted to tune the resistance×area (RA) value. As the tunnel barrier thickness increases or the degree of oxidation of the metal or alloy in the tunnel barrier increases, the RA value also becomes greater.

Figure 1F:
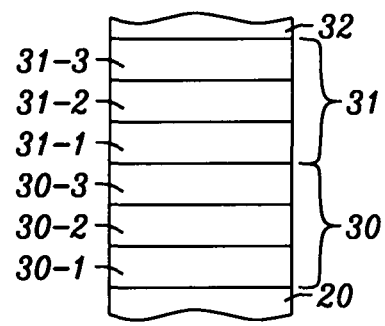

In the most general embodiment, the free layer stack 35-1 in FIG. 1*a* and FIG. 1*b* has only two magnetic layers 30, 31 where a first free layer (FL1) 30 contacts a top surface of the tunnel barrier 20 and has a high boron content of 25-50 atomic %, and a second free layer (FL2) 31 has a low boron content from 1-20 atomic % and forms an interface with the first free layer. The FL1 and FL2 layers may have different compositions. However, both layers 30, 31 have a composition that is selected from CoB, FeB, CoFeB, CoFeNiB, or CoFeBQ described previously. Also, the present disclosure encompasses an embodiment depicted in FIG. 1*e* wherein the alloy in one or both FL1, FL2 layers is replaced by a bilayer 30-1/30-2 (and 31-1/31-2) that includes a boron layer, and a layer of Co, Fe, CoFe, CoFeNi, or CoFeQ. For example, a CoFeB alloy layer may be replaced by a bilayer represented by CoFe/B or B/CoFe. Moreover, one or both of FL1 and FL2 may have a multilayer configuration 30-1/30-2/30-3 (or 31-1/31-2/31-3) comprised of one or more B layers and one or more layers selected from Co, Fe, CoFe, CoFeB, CoFeNi, and CoFeQ as shown in FIG. 1*f*. Each of the FL1 and FL2 layers preferably has a thickness from 1 to 10 Angstroms.

In some embodiments, optional layers 32, 33 are included. Second non-magnetic (NM2) layer 32 is one of Ru, Rh, or Ir and functions as an anti-ferromagnetic coupling layer thereby causing the magnetic moments (not shown) of the FL1, FL2 layers to be aligned in an opposite direction to the magnetic moment of a third free layer (FL3) 33. Similar to NM1 functionality, the NM2 layer may be employed to balance dipolar field and writing symmetry in the MTJ.

In other embodiments, NM2 layer 32 is a moment diluting layer with a composition that is an element M selected from Ru, Ta, Ti, W, Zr, Hf, Nb, Mo, V, Mg, and Cr, or is an alloy which includes a magnetic element (Fe, Co, or Ni) and a non-magnetic element M as described earlier with regard to NM1 12. As a result, the magnetic moments of layers 30, 31, 33 are aligned in the same direction and crystalline character in the subsequently deposited FL3 layer is blocked until an annealing step is performed following deposition of all MTJ layers. The thickness of the NM2 layer may vary between 1 and 10 Angstroms to adjust the coupling strength between FL2 31 and FL3 33, the TMR ratio, and magnetostriction ($\lambda$). A strong coupling (Hcp) between the FL2 and FL3 layers is desirable in order to minimize noise in the MTJ and improve the signal to noise (SNR) ratio. Moreover, magnetic stability improves as Hcp increases. FL3 layer 33 may be comprised of any magnetic material including Co, Fe, CoFe, and alloys thereof with Ni, B, or other metals. The FL3 layer may be a laminate of Co or CoFe, with Ni or NiCo. The thickness of the FL1/FL2 stack is preferably less than or equal to about 20 Angstroms to promote PMA in the FL1 and FL2 layers.

In yet another embodiment (not shown), the NM2 layer may be omitted to give a free layer stack that is a trilayer represented by a FL1/FL2/FL3 configuration.

Note that depending on the magnetic memory state "0" or "1" in MTJ 1, the magnetic moments (not shown) of FL1 30 and FL2 31 may be aligned either in the same direction or in the opposite direction with respect to magnetic moment 14*a* in FIG. 1*a*, or with respect to magnetic moment 14*b* in FIG. 1*b*. Moreover, the magnetization in the FL1 and FL2 layers is always in the same direction.

In all embodiments, the uppermost layer in the MTJ is a capping layer 40 that may be Ru, Ta, or a combination thereof. In other embodiments, the capping layer may comprise a metal oxide that interfaces with the free layer stack 35-1 to promote or enhance PMA in the adjoining free layer.

Figure 2A:
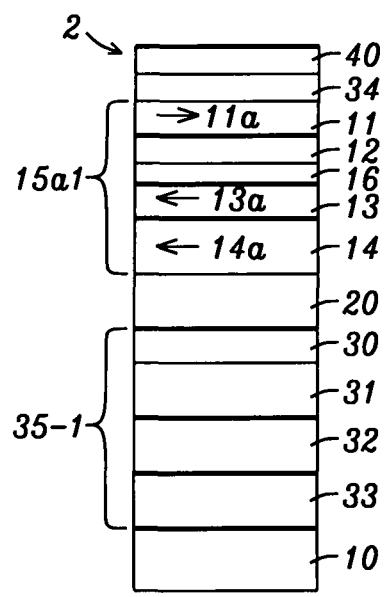
FIGS. 2a-2b are cross-sectional views that depict a MTJ stack of layers in a top spin valve configuration according to another embodiment of the present disclosure.

In FIG. 2*a*, another embodiment of the present disclosure is depicted where the MTJ 2 has a top spin valve configuration. The composition of layers is retained from FIG. 1*a* but the ordering of layers in the MTJ stack is modified. In particular, free layer stack 35-1 is switched with reference layer 15*a*1, and the ordering of layers within each stack 15*a*1, 35-1 is reversed such that FL3 now contacts the bottom layer 10, and AP1 layer 14 contacts a top surface of tunnel barrier 20. In other words, the free layer may have a FL2/FL1 structure or an optional FL3/NM2/FL2/FL1 configuration with the FL1 layer contacting a bottom surface of the tunnel barrier while the reference layer has an AP1/NM1/AP2 configuration in which a lower AP1 layer 14 has a boron content of 1-20 atomic % and an upper AP1 layer 13 has a boron content of 25-50 atomic %. When a third AP1 layer 16 is included, layer 16 is the uppermost AP1 layer. In some embodiments, an optional AFM layer 34 is provided between AP2 layer 11 and capping layer 40. FIG. 2*a* indicates reference layers 11, 13, 14 have in-plane magnetization 11*a*, 13*a*, 14*a*.

Figure 2B:
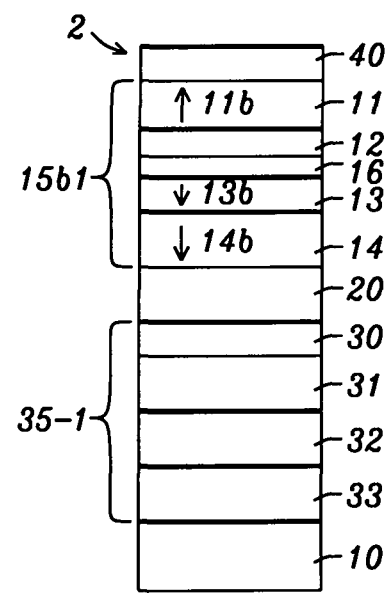

In a preferred top spin valve configuration illustrated in FIG. 2*b*, each of the AP1 layers 13, 14, and AP2 layer 11 has PMA as indicated by magnetic moment directions 13*b*, 14*b*, 11 *b*, respectively. Similar to FIG. 2*a*, the free layer may have a FL3/FL2/NM2/FL1 configuration where FL3 33 contacts bottom layer 10, and FL1 30 contacts a bottom surface of tunnel barrier 20. Furthermore, AP1 layer 14 adjoins a top surface of the tunnel barrier, and the AP2 layer contacts the capping layer 40. When NM2 is a moment diluting layer, the magnetic moments (not shown) of the FL1, FL2, FL3 layers may either be aligned in the same direction as AP1 magnetization 14*b*, or all may be aligned opposite to the AP1 layer magnetization 13*b*, 14*b* direction depending on the memory state of MTJ 2. Optional AP1 layer 16 has a magnetization in the same direction as the other AP1 layers.

Figure 3:
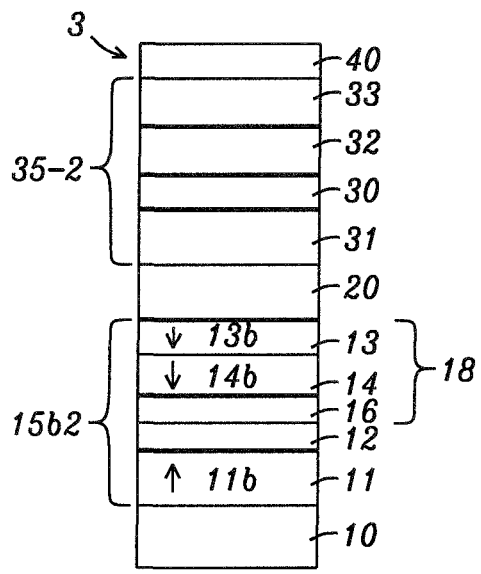
FIG. 3 is a cross-sectional view of a MTJ stack of layers with a bottom spin valve configuration according to a third embodiment of the present disclosure.

In an alternative bottom spin valve embodiment depicted as MTJ 3 in FIG. 3, the positions of FL1 30 and FL2 31 in FIG. 1*b* may be switched so that the FL2 layer contacts a top surface of the tunnel barrier 20 while FL1 adjoins the NM2 layer 32 to give a FL2/FL1/NM2/FL3 configuration for free layer 35-2. In alternative embodiments, the NM2 layer may be omitted to give a FL2/FL1/FL3 configuration, or both NM2 and FL3 are omitted to provide a FL2/FL1 free layer stack. Furthermore, AP1 layers 13, 14 may be switched in the reference layer stack 15*b*2 to give a composite AP1 layer 18 wherein AP1 layer 13 with 25-50 atomic % boron contacts a bottom surface of the tunnel barrier, and AP1 layer 14 adjoins a top surface of NM1 layer 12. When optional AP1 layer 16 is inserted in the AP1 stack 18, layer 16 is located a greater distance from the tunnel barrier than layers 13, 14. The reference layer 18 has an AP2 layer 11 formed on the bottom layer 10 and NM1 is an anti-ferromagnetic coupling layer, or a moment diluting layer. In the exemplary embodiment representing a SyAP configuration with perpendicular magnetic anisotropy, the AP layer has a magnetic moment 11*b* aligned opposite to the direction of magnetic moments 13b, 14b for the AP1 layers, and NM1 is an anti-ferromagnetic coupling layer.

Figure 4:
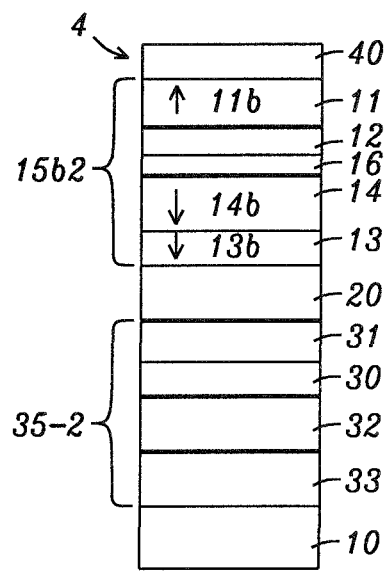
FIG. 4 is a cross-sectional view of a MTJ stack of layers with a top spin valve configuration according to a fourth embodiment of the present disclosure.

Referring to FIG. 4, an alternative top spin valve embodiment is shown in MTJ 4 wherein the positions of free layer 35-2 and reference layer 15b2 in FIG. 3 are switched. In addition, the ordering of layers within the free layer and reference layer are reversed. In particular, AP1 layer 13 contacts a top surface of tunnel barrier 20 and AP1 layer 14 is formed on the AP1 layer with high B content while AP2 layer 11 interfaces with a bottom surface of capping layer 40. Also, FL2 31 contacts a bottom surface of the tunnel barrier, and FL3 33 interfaces with a top surface of bottom layer 10. Otherwise, all the properties and compositions of each of the layers in MTJ 3 and 4 are retained from previous embodiments. The NM2 layer 32 when present may either enable anti-ferromagnetic coupling between FL1 and FL3 layers in FIGS. 3-4, or provide a moment diluting effect within the free layer.

Figure 5:
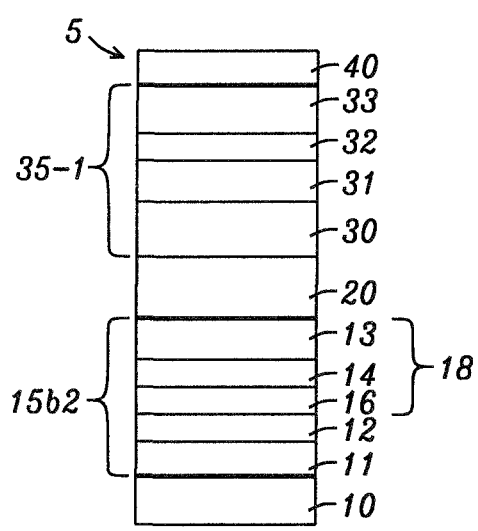
FIG. 5 is a cross-sectional view of a MTJ stack having a bottom spin valve configuration formed according to a fifth embodiment of the present disclosure.

In yet another embodiment depicted in FIG. 5, AP1 layer 17 in the FIG. 1b embodiment is replaced by AP1 layer 18 to give a reference layer 15b2 configuration as depicted earlier. Meanwhile, the free layer stack 35-1 is retained from FIG. 1b such that high boron content FL1 layer 30 contacts a top surface of the tunnel barrier 20. High boron content AP1 layer 13 adjoins a bottom surface of the tunnel barrier. The present disclosure also anticipates a top spin valve design (not shown) where placement of free layer stack 35-1 and reference layer 15b2 is switched.

Figure 6:
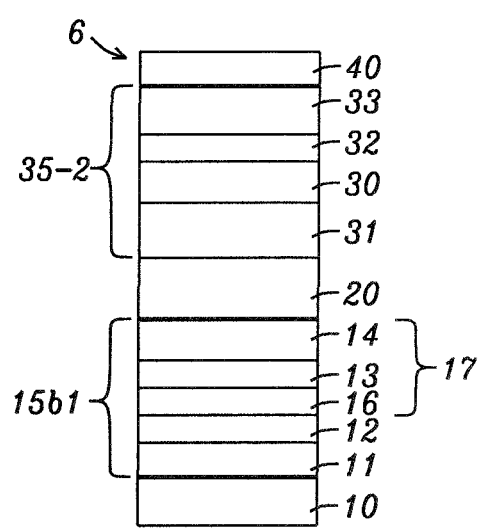
FIG. 6 is a cross-sectional view of a MTJ stack having a bottom spin valve configuration formed according to a sixth embodiment of the present disclosure.

Referring to FIG. 6, another embodiment of the present disclosure is illustrated where the free layer stack 35-1 in FIG. 1b is replaced by free layer stack 35-2. Meanwhile, reference layer 15b1 is retained such that low boron content AP1 layer 14 contacts a bottom surface of tunnel barrier 20. Low boron content FL2 31 adjoins a top surface of the tunnel barrier. It should be understood that the positions of reference layer 15b1 and free layer stack 35-2 may be switched to provide a top spin valve version (not shown) of the MTJ stack found in FIG. 6.

Figure 7:
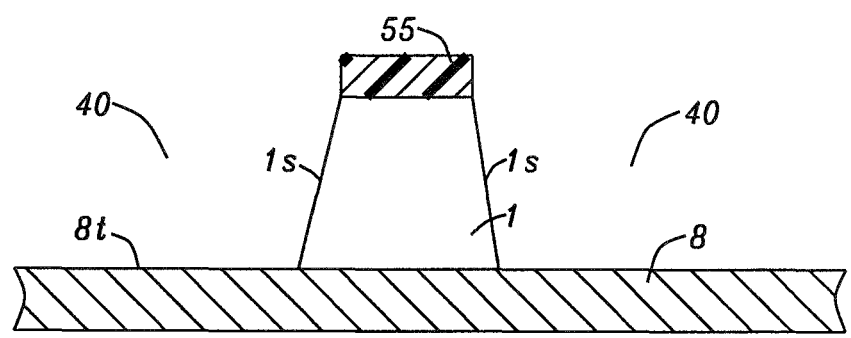
Figure 8:
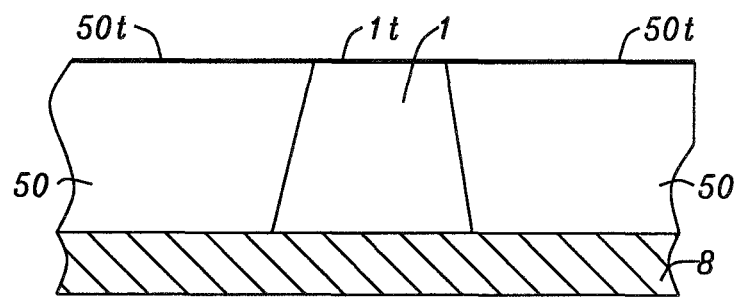

The present disclosure also encompasses a method of fabricating a MTJ in a magnetic memory element as illustrated in FIGS. 7-9. According to one embodiment, a MTJ stack of layers is formed on a bottom conductor 8 depicted in FIG. 7. All layers in the MTJ stack may be deposited in a DC sputtering chamber of a sputtering system such as an Anelva C-7100 sputter deposition system that includes ultra high vacuum DC magnetron sputter chambers with multiple targets and at least one oxidation chamber. Typically, the sputter deposition process involves an inert gas such as Ar and a base pressure between $5 \times 10^{-8}$ and $5 \times 10^{-9}$ torr. A lower pressure enables more uniform films to be deposited. The temperature in the sputter deposition chamber during deposition processes may vary from room temperature to 400° C.

The fabrication process according to one embodiment involves depositing a seed layer and then a reference layer 15b1 or 15b2 as previously described. A first Mg, metal, or alloy layer having a thickness between 4 and 8 Angstroms is deposited on an uppermost AP1 layer which is layer 13 or 14 in a bottom spin valve embodiment, or on FL1 30 or FL2 31 in a top spin valve structure. Thereafter, the fabrication sequence involves oxidizing the first Mg, metal, or alloy layer with a natural oxidation (NOX) process, and then depositing a second Mg, metal, or alloy layer with a thickness of 2 to 4 Angstroms on the oxidized first Mg, metal, or alloy layer. The second Mg (or metal or alloy) layer serves to protect the subsequently deposited free layer from oxidation. In a bottom spin valve embodiment, the free layer stack is deposited followed by the capping layer. During an annealing step that follows deposition of the uppermost layer in the MTJ stack of layers, oxygen tends to diffuse from the lower metal oxide layer into the second metal or alloy layer thereby oxidizing the latter to form a tunnel barrier that is substantially oxidized throughout.

The NOX process may be performed in an oxidation chamber within the sputter deposition system by applying an oxygen pressure of 0.1 mTorr to 1 Torr for about 15 to 300 seconds. Oxygen pressure between $10^{-6}$ and 1 Torr is preferred for an oxidation time mentioned above when a resistance×area (RA) value is desired from about 0.5 to 5 ohm-um². A mixture of $O_2$ with other inert gases such as Ar, Kr, or Xe may also be used for better control of the oxidation process. In alternative embodiments, the process to form a metal oxide or metal oxynitride tunnel barrier may comprise one or both of a natural oxidation and a conventional radical oxidation (ROX) process as appreciated by those skilled in the art.

Once all layers in the MTJ stack are formed, the MTJ stack is annealed in a vacuum oven between 330° C. to about 400° C. for about 1 to 5 hours to enhance PMA in one or both of the reference layer and free layer, increase coercivity (Hc) and the uniaxial magnetic anisotropy field (Hk), and promote crystallinity in the AP1 layer/tunnel barrier/FL1/FL2 stack of layers.

Next, a photoresist layer is coated on a top surface of the MTJ stack and is then patternwise exposed and developed to provide a photoresist mask 55. Thereafter, a conventional ion beam etch (IBE) or reactive ion etch (RIE) process is employed to remove unprotected portions of the MTJ stack and generate MTJ element 1 with sidewalls 1s that extend to a top surface 8t of the bottom conductor. The sidewalls may be perpendicular to the bottom conductor top surface, but are often non-vertical because of the nature of the etching process employed for the sidewall formation process. Openings 40 are formed on each side of the MTJ element. It should be understood that the photoresist patterning and etching sequence forms a plurality of MTJ elements typically arrayed in rows and columns on a plurality of bottom conductors. However, only one MTJ and one bottom conductor are shown in order to simplify the drawing.

Referring to FIG. 8, a first insulation layer 50 is deposited along sidewalls 1s and fills openings 40 between adjacent MTJ elements. Thereafter, a well known chemical mechanical polish (CMP) process may be performed to remove the photoresist mask and form a top surface 50t on the insulation layer that is coplanar with a top surface 1t of MTJ 1.

Referring to FIG. 9, a conventional sequence of steps that includes photoresist patterning and etch processes is used to form a top conductor 60 within a second insulation layer 70 wherein the top conductor adjoins the top surface of MTJ 1. The top conductor process typically produces a plurality of top conductor lines formed in a parallel array but only one top conductor is shown to simplify the drawing.

An experiment was conducted to demonstrate the improved performance achieved by implementing a reference layer/tunnel barrier/free layer stack in a MTJ according to an embodiment of the present disclosure. Two MTJ elements hereafter referred to as MTJ A and B and shown in Table 1 were fabricated with a seed layer/AP2/NM1/AP1/MgO/FL1/FL2/capping layer configuration. The key difference is that MTJ A includes a high boron content alloy ($Fe_{70}B_{30}$) in both of the AP1 layer and FL1 layer according to an embodiment of the present disclosure while MTJ B is formed according to a process of record (POR) practiced by the inventors and has the high boron content alloy only in FL1.

TABLE 1

Defect rate comparison for MTJ elements with AP1/MgO/FL1/FL2 bottom spin valve configurations

| MTJ | AP1 layer composition | Free layer (FL1/FL2) composition | Defect rate: 330° C., 30 min. anneal | Defect rate: 400° C., 30 min. anneal |
|---|---|---|---|---|
| A | $Co_{20}Fe_{60}B_{20}/Fe_{70}B_{30}$ | $Fe_{70}B_{30}/Co_{20}Fe_{60}B_{20}$ | 10 ppm | 10 ppm |
| B | $Co_{20}Fe_{60}B_{20}$ | $Fe_{70}B_{30}/Co_{20}Fe_{60}B_{20}$ | 10 ppm | 30 ppm |

For each MTJ configuration (A and B) shown in Table 1, a MTJ stack of layers was patterned into 100 nm circular devices. Defect rates were obtained by measuring test chips containing 8 Mb (8,388,608) devices per chip. The results from hundreds of test chips were averaged to provide the data shown in Table 1. Although the defect rate of MTJ A and MTJ B were both 10 ppm after a 330° C. anneal for 30 minutes, we observed a significant advantage with MTJ A following a 400° C. anneal since the MTJ A defect rate was maintained at 10 ppm. However, the defect rate for MTJ B increased threefold to 30 ppm after a 400° C., 30 minute annealing process.

It should be noted that the reference layer/tunnel barrier/free layer stack of the present disclosure may also be incorporated in magnetic tunnel junction that is used as a sensor in a read head, for instance. In this case, the MTJ element is formed between a bottom shield and a top shield in the read head.

The magnetic layers disclosed in the embodiments found herein, and in particular the boron containing alloys, may be fabricated without additional cost since no new sputtering targets or sputter chambers are required. No change in process flow is needed in current manufacturing schemes in order to implement one or more magnetic layers with a boron content as high as 50 atomic %. It should also be understood that one may also implement a MTJ formed according to an embodiment of the present disclosure in domain wall motion devices and in MRAM devices having more than one MgO tunnel barrier such as those devices with two tunnel barriers, and three terminals.

While this disclosure has been particularly shown and described with reference to, the preferred embodiment thereof, it will be understood by those skilled in the art that various changes in form and details may be made without departing from the spirit and scope of this disclosure.

We claim:

1. A magnetic tunnel junction (MTJ) element in a magnetic device, comprising:
   (a) a reference layer with an AP2/NM1/AP1 configuration wherein AP2 is a first magnetic layer, AP1 is a second magnetic layer that adjoins a tunnel barrier along a first surface, and NM1 is a first non-magnetic layer that enables anti-ferromagnetic coupling between AP1 and AP2, or provides a moment diluting effect in the reference layer, the AP1 layer is comprised of a first layer with a boron content between 25 and 50 atomic %, and a second layer with a low boron content between 1 and 20 atomic % and the second layer is amorphous that contacts the tunnel barrier;
   (b) the tunnel barrier; and
   (c) a free magnetic layer stack comprised of a first free magnetic layer with a boron content between 25 and 50 atomic %, and a second free magnetic layer with a low boron content between 1 and 20 atomic %, the first free magnetic layer forms an interface with the second free magnetic layer, and contacts a surface of the tunnel barrier that is opposite to the first surface, and wherein one or both of the first and second free layers have a multilayer configuration comprised of one or more layers consisting of B, and one or more layers selected from Co, Fe, CoFe, CoFeNi, CoFeB, and CoFeQ wherein Q is one of Zr, Hf, Nb, Ta, Mo, and W.

2. The MTJ element of claim 1 wherein each of the first and second layers in the AP1 layer have a composition that is selected from CoB, FeB, CoFeB, CoFeNiB, or CoFeBQ wherein Q is one of Zr, Hf, Nb, Ta, Mo, and W.

3. The MTJ element of claim 1 wherein each of the first and second layers in the AP1 layer has a thickness from about 1 to 10 Angstroms.

4. The MTJ element of claim 1 wherein each of the first free magnetic layer and second free magnetic layer has a thickness from about 1 to 10 Angstroms.

5. The MTJ element of claim 2 wherein one or both of the first and second layers in the AP1 layer are comprised of a bilayer configuration wherein one layer is Co, Fe, CoFe, CoFeNi, CoFeB, or CoFeQ, and a second layer is B.

6. The MTJ element of claim 2 wherein one or both of the first and second layers in the AP1 layer have a multilayer configuration comprised of one or more layers of B, and one or more layers selected from Co, Fe, CoFe, CoFeNi, CoFeB, and CoFeQ.

7. The MTJ element of claim 1 wherein the tunnel barrier is an oxide, oxynitride, or nitride of Mg, Ti, AlTi, MgZn, Al, Zn, Zr, Ta, or Hf, or is a native oxide of CoFeB, CoB, or FeB, or is a laminated stack of one or more of the aforementioned materials.

8. The MTJ element of claim 1 wherein NM1 is one of Ru, Rh, and Ir to give a synthetic anti-parallel (SyAP) configuration for the reference layer.

9. The MTJ element of claim 1 wherein the free magnetic layer stack has a FL1/FL2/NM2/FL3 configuration wherein FL1 is one of the first or second free magnetic layers, FL2 is the other of the first or second free magnetic layers, FL3 is a third free magnetic layer, and NM2 is a second non-magnetic layer that enables anti-ferromagnetic coupling between FL2 and FL3, or provides a moment diluting effect in the free magnetic layer stack.

10. The MTJ element of claim 1 wherein the magnetic device is a magnetoresistive random access memory (MRAM), spin-torque MRAM, embedded MRAM, or a spintronic device, or is a sensor in a read head.

11. A magnetic tunnel junction (MTJ) element in a magnetic device, comprising:
   (a) a reference layer with an AP2/NM1/AP1 configuration wherein AP2 is a first magnetic layer, AP1 is a second magnetic layer that adjoins a tunnel barrier along a first surface, and NM1 is a first non-magnetic layer that enables anti-ferromagnetic coupling between AP1 and AP2, or provides a moment diluting effect in the reference layer, the AP1 layer is comprised of a first layer with a boron content between 25 and 50 atomic %, and a second layer with a low boron content between 1 and 20 atomic % and the second layer is amorphous that contacts the tunnel barrier, and wherein one or both of the first and second layers in the AP1 layer have a multilayer configuration comprised of one or more layers consisting of B, and one or more layers selected from Co, Fe, CoFe, CoFeNi, CoFeB, and CoFeQ wherein Q is one of Zr, Hf, Nb, Ta, Mo, and W;

(b) the tunnel barrier; and (c) a free magnetic layer stack comprised of a first free magnetic layer with a boron content between 25 and 50 atomic %, and a second free magnetic layer that is one of CoB, FeB, or CoFeB with a low boron content between 1 and 20 atomic %, the first free magnetic layer forms an interface with the second free magnetic layer, and contacts a surface of the tunnel barrier that is opposite to the first surface, and wherein both of the first and second free magnetic layers have a multilayer configuration comprised of one or more layers of B, and one or more layers selected from Co, Fe, CoFe, CoFeNi, CoFeB, and CoFeQ.

* * * * *